United States Patent
Sano et al.

(10) Patent No.: US 8,017,674 B2
(45) Date of Patent: Sep. 13, 2011

(54) HEAT-CONDUCTIVE ADHESIVE

(75) Inventors: Hiroki Sano, Iwakuni (JP); Hiroshi Hara, Iwakuni (JP); Tatsuichiro Kon, Chiyoda-ku (JP)

(73) Assignee: Teijin Limited, Osaka (JP)

( * ) Notice: Subject to any disclaimer, the term of this patent is extended or adjusted under 35 U.S.C. 154(b) by 208 days.

(21) Appl. No.: 12/373,013

(22) PCT Filed: Jul. 27, 2007

(86) PCT No.: PCT/JP2007/064736
§ 371 (c)(1),
(2), (4) Date: Jan. 8, 2009

(87) PCT Pub. No.: WO2008/013252
PCT Pub. Date: Jan. 31, 2008

(65) Prior Publication Data
US 2009/0250655 A1    Oct. 8, 2009

(30) Foreign Application Priority Data

Jul. 28, 2006 (JP) ................................. 2006-206181
Jul. 28, 2006 (JP) ................................. 2006-206182
Aug. 28, 2006 (JP) ................................. 2006-230429

(51) Int. Cl.
*C08J 5/04* (2006.01)

(52) U.S. Cl. ........................... 524/66; 524/495; 524/496

(58) Field of Classification Search ................... 524/66, 524/495, 496
See application file for complete search history.

(56) References Cited

U.S. PATENT DOCUMENTS

| 3,923,697 A | * | 12/1975 | Ellis .............................. 252/506 |
| 4,861,653 A | * | 8/1989 | Parrish .......................... 442/349 |
| 5,026,748 A | * | 6/1991 | Adams et al. .................. 524/66 |
| 5,721,308 A | * | 2/1998 | Yamamoto et al. ........... 524/495 |
| 6,482,335 B1 | * | 11/2002 | Greene ......................... 252/511 |

FOREIGN PATENT DOCUMENTS

| CN | 1057282 A | | 12/1991 |
| JP | 51090338 A | * | 8/1976 |
| JP | 61-218669 A | | 9/1986 |
| JP | 06-212137 A | | 8/1994 |
| JP | 07-003229 A | | 1/1995 |
| JP | 07003229 A | * | 1/1995 |
| JP | 08-041730 A | | 2/1996 |
| JP | 2005-194372 A | | 7/2005 |

OTHER PUBLICATIONS

JP 07-003229A, Hojo et al., Jan. 1995, Machine translation.*
JP 51090338 A, Aug. 1976, Derwent AB.*

* cited by examiner

*Primary Examiner* — Satya B Sastri
(74) *Attorney, Agent, or Firm* — Sughrue Mion, PLLC

(57) ABSTRACT

The invention provides a heat-conductive adhesive with high heat spread properties and excellent handleability. A pitch-based carbon fiber filler with high thermal conductivity and a smooth surface is combined with an adhesive resin to produce a heat-conductive adhesive with controlled viscosity and excellent handleability.

11 Claims, No Drawings

HEAT-CONDUCTIVE ADHESIVE

TECHNICAL FIELD

The present invention relates to a heat-conductive adhesive that employs a pitch-based carbon fiber filler as starting material. More specifically, the invention relates to a heat-conductive adhesive obtained by combining a surface-smooth pitch-based carbon fiber filler with a curable resin. The heat-conductive adhesive of the invention is a heat-conductive adhesive with high thermal conductivity and handleability, and it is suitable as a heat-spreading material for heat-generating electronic parts.

BACKGROUND ART

High-performance carbon fibers are classified as either PAN-based carbon fibers obtained using polyacrylonitrile (PAN) as the starting material, or pitch-based carbon fibers obtained using a series of pitches as starting material. Carbon fibers are widely used for space and aviation, construction and civil engineering, as well as sports and leisure purposes, taking advantage of their extremely high strength and elastic modulus compared to ordinary synthetic polymers.

Carbon fibers have high thermal conductivity compared to ordinary synthetic polymers, and they are considered to have excellent heat spread properties. Carbon materials such as carbon fibers are also reported to exhibit high thermal conductivity by movement of phonons. Phonons are efficiently transmitted in materials with developed crystal lattices. Most currently marketed PAN-based carbon fibers do not have sufficiently developed crystal lattices, and because their thermal conductivity is lower than 200 W/(m·K), they are not necessarily satisfactory from the viewpoint of thermal management. Pitch-based carbon fibers, on the other hand, have a high degree of graphitization and well developed crystal lattices, and are therefore recognized as being more capable of achieving high thermal conductivity than PAN-based carbon fibers.

With the ever increasingly high densities of heat-generating electronic parts and the reduced sizes, thicknesses and weights of electronic devices including portable personal computers in recent years, demand continues to rise for lower heat resistance in the heat-spreading members used therein, and heat-spreading members with smaller thicknesses are strongly desired. Examples of heat-spreading members include heat-conductive sheets composed of cured products filled with heat-conductive inorganic powders, heat-conductive spacers composed of flexible cured products with heat-conductive inorganic powders that fill gelatinous substances, heat-conductive pastes with flow properties having heat-conductive inorganic powder filling liquid silicone, heat-conductive adhesives having heat-conductive inorganic powder filling curable substances, and phase change-type heat-spreading members that utilize resin phase transitions. The types of members among these that are more easily thinned are heat-conductive pastes, heat-conductive adhesives and phase change-type heat-spreading members, but for general-purpose articles it is preferred to use heat-conductive pastes or heat-conductive adhesives, based on their cost advantage and performance record. Heat-conductive adhesives have the advantage of facilitating attachment, and various forms thereof may be used.

For improved thermal conductivity of heat-conductive adhesives, a curable resin may be highly packed with a substance exhibiting excellent thermal conductivity, and a very low thickness formed. A low thickness can be formed by adjusting the viscosity of the adhesive and the size of the filler. As substances with excellent thermal conductivity, there are known metal oxides, metal nitrides, metal carbides and metal hydroxides such as aluminum oxide, boron nitride, aluminum nitride, magnesium oxide, zinc oxide, silicon carbide, quartz, aluminum hydroxide and the like. However, metal material-based fillers have high specific gravity, and the weights of the heat-conductive adhesives are therefore increased.

Research is therefore being conducted on heat-conductive adhesives employing carbon materials with low specific gravity and high thermal conductivity, and especially carbon fibers.

Patent document 1 describes a heat-conductive filler composed of graphitized carbon fibers covered with a ferromagnetic material, the heat-conductive filler being characterized in that the graphitized carbon fibers are obtained using a mesophase pitch as the starting material for spinning, infusibility treatment and carbonization, and then pulverizing, followed by graphitization. Subsequent covering with the ferromagnetic material increases the orientation of the heat-conductive filler, the thermal conductivity being increased by orientation with a magnetic field. A strong magnetic field is therefore necessary for its use as a heat-conductive adhesive, and this has a particularly negative effect on electronic parts.
[Patent document 1] Japanese Unexamined Patent Publication No. 2002-146672

DISCLOSURE OF THE INVENTION

It is an object of the present invention to provide an adhesive with high thermal conductivity, low viscosity and excellent handleability.

The present inventors have completed this invention upon finding that a pitch-based carbon fiber filler with a smooth surface has excellent dispersibility in adhesives and satisfactory thermal conductivity, while also notably improving the handleability of heat-conductive adhesives and exhibiting an effect of filling the gaps by creating a fixed distribution for the fiber size, allowing the pitch-based carbon fiber filler to be filled to a high degree. Specifically, the object of the invention is achieved by a heat-conductive adhesive comprising a combination of 100 parts by weight of a pitch-based carbon fiber filler which has an essentially smooth surface as observed with a scanning electron microscope and which has a crystallite size of at least 5 nm in the direction of growth of the hexagonal mesh surface, as a heat-conductive material, and 25-1900 parts by weight of a curable resin, the heat-conductive adhesive being characterized in that the thermal conductivity of the heat-conductive adhesive is at least 3 W/(m·K). The heat-conductive adhesive of the invention has a mean fiber size of 5-20 μm and a fiber size dispersion percentage with respect to the mean fiber size (CV value) of 5-20.

As methods for obtaining a heat-conductive adhesive comprising a curable resin and a pitch-based carbon fiber filler having an essentially smooth surface as observed with a scanning electron microscope, there may be mentioned 1) a method in which pitch fibers are pulverized and fired, and then graphitized to obtain a pitch-based fiber filler, which is then introduced into a curable resin, and 2) a method in which a web comprising pitch fibers is fired and then graphitized, to obtain three-dimensional random web carbon fibers wherein the fibers are intermingled, and this is combined with a curable resin. This minimizes loss of the pitch-based carbon fiber filler and yields a pitch-based carbon fiber filler with smooth surfaces, so that a heat-conductive adhesive exhibiting both high thermal conductivity and handleability can be produced.

The invention also encompasses adhesives containing the conductive inorganic filler or insulating inorganic filler as a heat-conductive material.

EFFECT OF THE INVENTION

The heat-conductive adhesive of the invention utilizes the smoothness of the surface of the pitch-based carbon fiber filler, whereby the propagation of graphite crystals (the crystallite size in the direction of growth of the hexagonal mesh surface) is controlled to be at least above a fixed size, in order to achieve both high thermal conductivity and high handleability due to the low viscosity. The heat-conductive adhesive of the invention preferably has a mean fiber size of 5-20 μm and a fiber size dispersion percentage with respect to the mean fiber size (CV value) of 5-20; using such a pitch-based carbon fiber filler can satisfactorily fill the composite to provide an adhesive with high thermal conductivity.

DETAILED DESCRIPTION OF THE INVENTION

Embodiments of the invention will now be explained.

The invention is a heat-conductive adhesive comprising a combination of 25-1900 parts by weight of a curable resin with respect to 100 parts by weight of a pitch-based carbon fiber filler which has an essentially smooth surface as observed with a scanning electron microscope and which has a crystallite size of at least 5 nm in the direction of growth of the hexagonal mesh surface, the heat-conductive adhesive being characterized in that the thermal conductivity of the heat-conductive adhesive is at least 3 W/(m·K).

The pitch-based carbon fiber filler used for the invention is characterized by having an essentially smooth surface as observed with a scanning electron microscope. The term "smooth" means that no irregularities are seen in the surface, no cracks are seen in the surface and no splitting is seen in the filler, under observation with a scanning electron microscope. The term "essentially smooth" means that no more than 10 defects are present in the visual field (1000× magnification) with observation using an electron microscope, for example.

If the pitch-based carbon fiber filler used has an essentially smooth surface as observed under a scanning electron microscope, the interaction between the pitch-based carbon fiber filler and curable resin will be reduced when the pitch-based carbon fiber filler and curable resin are combined to form the heat-conductive adhesive, and as a result the viscosity of the heat-conductive adhesive will be lower, the handleability will be improved and a higher degree of packing of the heat-conductive filler will be possible. If the pitch-based carbon fiber filler is not smooth, on the other hand, interaction between the pitch-based carbon fiber filler and curable resin will increase, resulting in a greater viscosity of the heat-conductive adhesive and reduced handleability.

As preferred methods for obtaining an adhesive comprising a pitch-based carbon fiber filler having an essentially smooth observed surface as described above, there may be mentioned 1) a method in which pitch fibers are pulverized and fired, and then graphitized to obtain a pitch-based staple fiber filler, which is introduced into a curable resin, and 2) a method in which a web comprising pitch fibers is fired and then graphitized, to obtain a three-dimensional random web carbon fiber filler wherein the fibers are intermingled, and this is combined with a curable resin.

Obtaining a pitch-based carbon fiber filler by such methods can reduce loss of the pitch-based carbon fiber filler. If pulverization is carried out after graphitization to obtain the carbon fibers, a greater amount of pitch-based carbon fiber filler loss will occur.

The pitch-based carbon fiber filler used for the invention must have a crystallite size of at least 5 nm in the direction of growth of the hexagonal mesh surface. The crystallite sizes in the direction of growth of the hexagonal mesh surface can be determined by a known method, such as based on the diffraction profile from the (110) plane of the carbon crystals, obtained by X-ray diffraction. The crystallite size is important because heat conduction is supported primarily by phonons, and it is the crystals that generate phonons. It is preferably at least 20 nm and more preferably 30 nm or greater.

The mean fiber size of the pitch-based carbon fiber filler used for the invention is preferably 5-20 μm. At less than 5 μm, it may not be possible to maintain the web shape and productivity will be poor. If the fiber size exceeds 20 μm, variation will increase in the infusibility treatment step and partial fusion may occur. It is more preferably 5-15 μm and even more preferably 8-12 μm.

The CV value, determined as the percentage of the fiber size distribution with respect to the mean fiber size, is preferably 5-20. A CV value of less than 5 may result in a poorly packed condition of the filler in the cured resin. This can occur because a low distribution of the fiber size increases the sizes of the gaps in the filler that are produced during packing. The CV value preferably does not exceed 20 from the viewpoint of productivity, since this will tend to increase the fibers with diameters of 20 μm and greater which can cause trouble during infusibility treatment.

A fiber size distribution represented by this CV value will allow efficient packing of the filler in the cured resin. The CV value for the fiber size is more preferably 8-15.

The CV value is determined in the following manner.

[Formula 1]

$$CV = \frac{S_1}{\overline{D_1}} \quad (1)$$

Here, $S_1$ is fiber size dispersity, and $\overline{D_1}$ is the mean fiber size.

$S_1$ is determined by the following formula (2).

$$S_1 = \sqrt{\frac{\sum_i (D - \overline{D_1})^2}{n^2}} \quad (2)$$

Here, D is the fiber size of each of n fibers, and $\overline{D_1}$ is the mean value of n fiber sizes, where n is the number of fibers.

For method 1), the mean length of the pitch-based carbon fiber filler is preferably 5-6000 μm. Fiber properties will not be exhibited at smaller than 5 μm, and sufficient thermal conductivity may not be achieved. At greater than 6000 μm, intermingling of the fibers will notably increase, raising the viscosity of the heat-conductive adhesive and making handling more difficult. It is preferably 10-3000 μm, even more preferably 20-1000 μm, and most preferably 30-250 μm. Even if the mean fiber length exceeds 500 μm in the pitch-based carbon fiber filler of the invention, efficient packing can be accomplished because of the fiber size distribution and surface smoothness. With method 1), it is possible to increase the packed state of the pitch-based carbon staple fiber filler in the adhesive due to the short fiber lengths and the fiber size distribution, and more preferably by combining 25-400 parts by weight of the curable resin, even more preferably 40-230 parts by weight of the curable resin and yet more preferably 40-230 parts by weight of the curable resin with respect to 100 parts by weight of the pitch-based carbon fiber filler, it is possible to provide a superior heat-conductive adhesive.

For three-dimensional random web carbon fibers obtained by method 2), the mean length of the pitch-based carbon fiber filler is preferably 50-1000 mm. A mean length of less than 50 mm will result in poor intermingling of the fibers, making it impossible to effectively exhibit thermal conductivity. At greater than 1000 mm, intermingling of the fibers will notably increase, making handling more difficult. A more preferred range for the mean length is 50-500 mm and even more preferably 50-300 mm.

The intermingling of the carbon fibers in the adhesive can be confirmed by observing the surface of the cured adhesive with an optical microscope or the like. For more detailed observation of the state of intermingling, the pre-curing resin may be removed before observation with an optical microscope. When mixed with a resin, three-dimensional random web carbon fibers separate from each other while retaining some degree of contact between them, and thus become dispersed in the adhesive.

Intermingling of the carbon fibers by this method allows the carbon fibers to be in three-dimensional contact, so that effective heat conduction can be exhibited. On the other hand, since the handleability is somewhat reduced, the content of the pitch-based carbon fiber filler in the adhesive is lower. For handleability, the amount of curable resin is preferably 150-1900 parts by weight with respect to 100 parts by weight of the pitch-based carbon fiber filler.

The thermal conductivity of the heat-conductive adhesive of the invention may be measured by a known method, among which the probe method, hot disk method and laser flash method are preferred, and the probe method is preferred in terms of ease. The thermal conductivity of the carbon fibers themselves will usually be about a few hundred W/(m·K), but when used in combination with an adhesive or the like, the thermal conductivity is drastically reduced by defects, inclusion of air and formation of unexpected gaps. Consequently, it has been considered difficult to achieve thermal conductivity exceeding 2 W/(m·K) for heat-conductive adhesives. According to the invention, however, this problem is solved by using a pitch-based carbon fiber filler with an essentially smooth observation surface, whereby 3 W/(m·K) and greater can be realized for an adhesive. It is more preferably 10 W/(m·K) or greater and even more preferably 15 W/(m·K) or greater.

A process for production of a pitch-based carbon fiber filler to be used for the invention will now be explained in detail.

As examples of starting materials for the pitch-based carbon fiber filler to be used for the invention there may be mentioned fused heterocyclic compounds including fused polycyclic hydrocarbon compounds such as naphthalene or phenanthrene, and fused heterocyclic compounds such as petroleum pitch or coal pitch. Preferred among these are fused polycyclic hydrocarbon compounds such as naphthalene and phenanthrene, with optical anisotropic pitch and especially mesophase pitch being especially preferred. Any one of these may be used alone or two or more may be used in appropriate combinations, but using mesophase pitch alone is particularly preferred for achieving improved thermal conductivity of the carbon fibers.

The softening point of the starting pitch may be determined by the Mettler method, and it is preferably between 250° C. and 350° C. If the softening point is below 250° C., fusing between fibers and significant heat shrinkage will occur during infusibility treatment. If it is higher than 350° C., thermal decomposition of the pitch will occur making it difficult to form filaments.

The starting pitch is melted and then discharged from a nozzle and cooled, as melt spinning to form a filament. There are no particular restrictions on the spinning process, and there may be mentioned ordinary spinning processes wherein pitch discharged from a nozzle is wound up on a winder, melt blowing processes that use hot air as the atomizing source and centrifugal spinning processes wherein centrifugal force is used to draw the pitch, with melt blowing processes being preferred from the viewpoint of high productivity and controllability.

After melt spinning of the starting pitch, it is subjected to infusibility treatment and firing, pulverization if necessary, and finally graphitization to produce a pitch-based carbon fiber filler. Three-dimensional random web carbon fibers are obtained if no pulverization is carried out. Each step in an example of a melt blowing process will now be explained.

According to the invention, there are no particular restrictions on the shape of the spinning nozzle for the pitch fibers used as the starting material for the pitch-based carbon fibers, but preferably the ratio between the nozzle hole length and hole diameter (L/D) is greater than 4. There are also no particular restrictions on the temperature of the nozzle during spinning, and it may be any temperature at which a stable spinning state can be maintained, or in other words, any temperature at which the spinning pitch viscosity is 2-50 Pa·s and preferably 5-25 Pa·s.

The pitch fibers discharged through the nozzle hole are converted to staple fibers by blowing gas, heated to 100-350° C., at a linear speed of 100-10,000 m/min near the thinning point. The blowing gas may be air, nitrogen or argon, but air is preferred from the viewpoint of cost performance.

The pitch fibers are collected on a wire mesh belt and continuously formed into a mat, and then cross-lapped to form a three-dimensional random mat.

A three-dimensional random web is a web wherein the pitch fibers are three-dimensionally intermingled, in addition to being cross-lapped. Intermingling is a state wherein the fibers are entangled in contact with each other, with some degree of freedom of the fibers themselves. When mixed with a resin, therefore, the fibers are dispersed in the resin with increasing distances between them while leaving contact points. The fibers fuse together to form a web, which differs from a condition in which they cannot respond to deformation or external force. Such intermingling can be achieved using a "vapor tube" set at a location between the nozzle and the wire mesh belt. Since the filamentous fibers are intermingled three-dimensionally, they reflect in three dimensions the properties of fibers that are normally only exhibited as one-dimensional behavior.

The three-dimensional random web composed of the pitch fiber obtained in this manner can be subjected to infusibility treatment by a known method. The infusibility treatment can be carried out at 200-350° C. using air or a gas comprising air and added ozone, nitrogen dioxide, nitrogen, oxygen, iodine or bromine. From the viewpoint of safety and convenience, it is preferably carried out in air.

The infusibilized pitch fibers are then fired at 600-1500° C. in a vacuum or in an inert gas such as nitrogen, argon or krypton. Firing is usually carried out at ordinary pressure in low-cost nitrogen.

After the infusibility treatment or firing, the obtained fibers may be pulverized to obtain a pitch-based staple fiber filler for method 1). In most cases it will be pulverized after firing. The pulverizing may be carried out by a known method. Specifically, a ball mill, jet mill, crusher or the like may be used. When pulverization is not carried out, this results in three-dimensional random web carbon fibers for method 2).

The firing is followed by graphitization at 2000-3500° C. A more preferred range is 2300-3500° C. The graphitization will generally be carried out with a different type of inert gas depending on the type of furnace used. During graphitization, the fibers are preferably placed in a graphite crucible and shielded from external physical and chemical effects. The graphite crucible is not restricted in its size or shape so long as it can hold the prescribed amount of the pitch-based carbon fiber filler, but it is preferably a capped, highly airtight one in order to prevent damage to the pitch-based carbon fiber filler by reaction with water vapor or oxidizing gas in the furnace during graphitization or during cooling.

Before kneading with the curable resin, the pitch-based carbon fiber filler may be subjected to oxidation treatment by electrolytic oxidation or to treatment with a coupling agent or sizing agent for modification of the surface. The surface may also be covered with metal or ceramic by a physical vapor deposition process such as electroless plating, electrolytic plating, vacuum vapor deposition, sputtering, ion plating or the like, or chemical vapor deposition, coating, immersion or a mechanochemical process involving mechanical attachment of fine particles.

The heat-conductive adhesive of the invention may further contain as additives one or more inorganic fillers selected from the group consisting of aluminum oxide, magnesium oxide, zinc oxide, boron nitride, aluminum nitride, aluminum oxynitride, quartz and aluminum hydroxide.

When it is desired to control the electrical insulating properties of the heat-conductive adhesive, an electrical insulating inorganic filler may also be added. Specifically, there may be mentioned metal oxides such as aluminum oxide, magnesium oxide or zinc oxide, metal hydroxides such as aluminum hydroxide and magnesium hydroxide and metal nitrides such as boron nitride and aluminum nitride, among which aluminum oxide, magnesium oxide, zinc oxide, boron nitride, aluminum nitride, aluminum oxynitride, quartz and aluminum hydroxide are preferred. These inorganic fillers may be used alone or in combinations of two or more. The amount of inorganic filler added may be in the range of 1-2500 parts by weight, preferably in the range of 1-500 parts by weight and even more preferably in the range of 1-50 parts by weight with respect to 100 parts by weight of the pitch-based carbon fiber filler. The amount is preferably not outside of these ranges to avoid problems such as reduced handleability of the adhesive or inability to achieve the desired electrical insulating properties.

On the other hand, when it is desired to control the electrical conductivity of the heat-conductive adhesive, a conductive filler such as a metal or its alloy, or graphite, may be added. Specifically, the heat-conductive adhesive of the invention may contain as additives one or more conductive fillers selected from the group consisting of magnesium, gold, silver, copper, aluminum, iron and graphite at 1-500 parts by weight with respect to 100 parts by weight of the pitch-based carbon fiber filler. Among these, graphite may be used as scaly graphite, expansive graphite, natural graphite, or rolled expansive graphite. The amount of conductive filler added may be in the range of 1-2500 parts by weight, preferably in the range of 1-500 parts by weight and even more preferably in the range of 1-50 parts by weight with respect to 100 parts by weight of the pitch-based carbon fiber filler. The amount is preferably not outside of these ranges to avoid problems such as reduced handleability of the adhesive or inability to achieve the desired electrical conductivity.

The viscosity of the adhesive before curing is preferably 5-150 Pa·s (50-1500 poise) at a shear rate of 1.7 (1/s). It is more preferably 10-100 Pa·s (100-1000 poise). At less than 5 Pa·s (50 poise), the flow property of the adhesive will be too high, causing immediate run-off and unsuitability as an adhesive. At greater than 150 Pa·s (1500 poise), the flow property will be too low, making it difficult to achieve thinning. When thinning is not necessary, however, the viscosity may be as high as 500 Pa·s. Preferably, viscosity increase is limited to no greater than about 300 Pa·s. The viscosity may be measured by a known method, and specifically it may be measured using a Brookfield viscometer.

The curable resin used for the invention is preferably an acrylic-based resin, epoxy-based resin, silicone-based resin, polyimide-based resin or urethane resin. Acrylic resins, epoxy resins, silicone resins, polyimide resins and urethane resins exhibit hermetic and insulating properties. By using these in a matrix it is possible to obtain a highly reliable heat-conductive adhesive.

The matrix can be hardened with moisture, heat, ultraviolet rays, a curing agent or the like in air to obtain adhesive force.

The viscosity of the pre-curing curable resin used for the invention is preferably 0.01-10 Pa·s (0.1-100 poise) at a shear rate of 1.7 (1/s). At lower than 0.01 Pa·s, the resin will tend to seep out from the adhesive, while at higher than 10 Pa·s the viscosity of the adhesive will be excessively high, reducing the handleability and interfering with high-degree packing. The range of 0.05-2 Pa·s is more preferred. The viscosity may be measured by a known method, and specifically it may be measured using a Brookfield viscometer.

The heat-conductive adhesive of the invention may be produced by kneading the materials with a universal mixing stirrer, kneader or the like. The viscosity can also be adjusted with a solvent capable of dissolving each resin.

There are no major restrictions on uses of the heat-conductive adhesive of the invention, and for example, it may be applied for heat spread of, specifically, electronic parts with large levels of heat release such as highly integrated circuits (MPU, CPU, etc.), electric power devices (power transistors, IGBT, etc.), transformers, luminescent devices (LED, laser diodes, lasers, etc.), and the like, and for example, it can increase heat spreading efficiency when placed between such devices (or chips) and circuit boards, heat sinks, heat pipes and the like. Such heat spread can reduce device malfunction and extend the usable life.

It can also be used to increase heat conduction efficiency between sensors or devices and their surroundings for various temperature sensors, heating/cooling devices (heaters, heat pipes, Pertier elements and the like).

Since the heat-conductive adhesive of the invention has electrical conductivity, it can be used for the purpose of anchoring electrical contacts in such devices in place of solder or the like, or even as a conductive paste for printing of wiring circuits or circuit elements, or as a filler for through-holes or via holes on laminated circuit boards.

The heat-conductive adhesive of the invention can be used for curing or semi-curing of the adhesive layer alone to obtain a self-standing film. The thermal conductivity also allows its use as conductive adhesive tape or film, as an anchoring film for devices (or chips) or electrical contacts, or as a dry film resist for via hole formation.

EXAMPLES

Examples of the invention will now be described with the understanding that the invention is not limited thereto.

The values in the examples were determined by the following methods.

(1) The mean fiber size of the pitch-based carbon fiber filler was determined by measuring 60 graphitized pitch-based carbon fiber fillers using a scale under an optical microscope according to JIS R7607 and calculating the average value. The CV value was simultaneously determined from the following formula (1).

[Formula 1]

$$CV = \frac{S_1}{\overline{D_1}} \quad (1)$$

Here, $S_1$ is fiber size dispersity, and $\overline{D_1}$ is the mean fiber size.

$S_1$ is determined by the following formula (2).

$$S_1 = \sqrt{\frac{\sum_i (D - \overline{D_1})^2}{n^2}} \quad (2)$$

Here, D is the fiber size of each of n fibers, and $\overline{D_1}$ is the mean value of n fiber sizes, where n is the number of fibers.

(2) The mean length of the pitch-based carbon fiber filler was determined by measuring 2000 graphitized pitch-based carbon fiber fillers using a scale under an optical microscope and calculating the average value.

(3) The crystallite size of the pitch-based carbon fiber filler was determined by the Gakushin method, measuring the reflection from the (110) plane in X-ray diffraction.

(4) The surface of the pitch-based carbon fiber filler was observed with a scanning electron microscope and the defects in the visual field at 1000× magnification were counted.

(5) The thermal conductivity of the heat-conductive adhesive was determined by coating a reference plate with the adhesive to a thickness of 1 mm, and using a QTM-500 by Kyoto Electronics Co., Ltd. for measurement of the cured heat-conductive adhesive by the probe method.

(6) The electrical conductivity of the heat-conductive adhesive was measured with a LORESTA EP (high electric conductivity region) and HIRESTA (low electric conductivity region) by Dia Instruments Co., Ltd.

Example 1

Pitch comprising a fused polycyclic hydrocarbon compound was used as the starting material. The optical anisotropy percentage was 100% and the softening point was 283° C. Using a cap with a 0.2 mmφ diameter, heated air was ejected from the slit at a linear speed of 5500 m per minute, dragging the molten pitch to form pitch-based staple fibers with a mean diameter of 14.5 μm. The melt viscosity of the pitch was 8 Pa·s. The spun fibers were collected on a belt to form a mat, and a three-dimensional random web composed of pitch-based staple fibers with a basis weight of 320 g/m² was obtained by cross-lapping.

The three-dimensional random web was heated in air from 170° C. to 285° C. at a mean temperature-elevating rate of 6° C./min, for infusibility treatment. The infusibilized three-dimensional random web was fired at 800° C., pulverized with a ball mill and graphitized at 3000° C. The mean fiber size of the pitch-based carbon fiber filler after graphitization was 9.8 μm, and the ratio of the fiber size dispersion to the mean fiber size (CV value) was 12%. The mean fiber length was 50 μm. The crystallite size in the direction of growth of the hexagonal mesh surface was 17 nm. When the surface of the pitch-based carbon fiber filler was observed with a scanning electron microscope, 6 defects were found in the visual field at 1000× magnification, indicating an essentially smooth surface.

While mixing 35 parts by weight of the pitch-based carbon staple fiber filler and half of the main solution of 65 parts by weight of a two-solution curable acrylic-based resin (ACRYSET 8087, trade name of Nippon Shokubai Co., Ltd.) for 30 minutes using a planetary mixer, the mixture was subjected to vacuum defoaming to produce an adhesive. The remaining half of the ACRYSET 8087 curing agent was added, and the thermal conductivity of the obtained cured heat-conductive adhesive was measured to be 6.1 W/(m·K). The electric conductivity was $1.5 \times 10^4$ Ω/sq.

Example 2

A pitch-based carbon fiber filler was produced by the same method as Example 1.

While mixing 35 parts by weight of the pitch-based carbon fiber filler with half of 65 parts by weight of a two-solution curable epoxy-based resin (EPIKOTE 871, trade name of Japan Epoxy Resins Co., Ltd.) for 30 minutes using a planetary mixer, the mixture was subjected to vacuum defoaming to produce an adhesive. The thermal conductivity of the cured heat-conductive adhesive, obtained by curing using the remaining half of the curing agent EPICURE 113, was measured to be 6.8 W/(m·K). The electric conductivity was $2.2 \times 10^4$ Ω/sq.

Example 3

A pitch-based carbon fiber filler was produced by the same method as Example 1.

While mixing 35 parts by weight of the pitch-based carbon fiber filler with half of the main solution of 65 parts by weight of a two-solution curable silicone-based resin (SD4570, trade name of Toray-Dow Silicone) for 30 minutes using a planetary mixer, the mixture was subjected to vacuum defoaming to produce an adhesive. A curing agent was added to the remaining half of the curing agent SD4570, and the thermal conductivity of the obtained cured heat-conductive adhesive was measured to be 5.9 W/(m·K). The electric conductivity was $1.8 \times 10^4$ Ω/sq.

Example 4

A pitch-based carbon fiber filler was produced by the same method as Example 1.

While mixing 35 parts by weight of the pitch-based carbon fiber filler with 65 parts by weight of a thermosetting polyimide-based resin (U-Varnish-A, trade name of Ube Industries, Ltd.) for 30 minutes using a planetary mixer, the mixture was subjected to vacuum defoaming to produce an adhesive. The thermal conductivity of the cured heat-conductive adhesive obtained by thermosetting at 160° C. was measured to be 6.0 W/(m·K). The electric conductivity was $1.9 \times 10^4$ Ω/sq.

Example 5

A pitch-based carbon fiber filler was produced by the same method as Example 1.

While mixing 35 parts by weight of the pitch-based carbon fiber filler with 65 parts by weight of a thermosetting urethane-based resin (SEIKABOND, trade name of Dainichi Seika Co., Ltd.) for 30 minutes using a planetary mixer, the mixture was subjected to vacuum defoaming to produce an adhesive.

The thermal conductivity of the cured heat-conductive adhesive obtained by thermosetting at 100° C. was measured to be 6.2 W/(m·K). The electric conductivity was $2.1 \times 10^4$ Ω/sq.

Example 6

A pitch-based carbon fiber filler was produced by the same method as Example 1.

While mixing 25 parts by weight of the pitch-based carbon fiber filler with 10 parts by weight of boron nitride and half of 65 parts by weight of a two-solution curable epoxy-based resin (EPIKOTE 871, trade name of Japan Epoxy Resins Co., Ltd.) for 30 minutes using a planetary mixer, the mixture was subjected to vacuum defoaming to produce an adhesive.

The thermal conductivity of the cured heat-conductive adhesive, obtained by curing using the remaining half of the curing agent EPICURE 113, was measured to be 5.9 W/(m·K). The electric conductivity was $1.5 \times 10^7$ Ω/sq.

Example 7

A pitch-based carbon fiber filler was produced by the same method as Example 1.

While mixing 25 parts by weight of the pitch-based carbon fiber filler with 10 parts by weight of silver powder and half of 65 parts by weight of a two-solution curable epoxy-based resin (EPIKOTE 871, trade name of Japan Epoxy Resins Co., Ltd.) for 30 minutes using a planetary mixer, the mixture was subjected to vacuum defoaming to produce an adhesive.

The thermal conductivity of the cured heat-conductive adhesive, obtained by curing using the curing agent EPICURE 113, was measured to be 6.3 W/(m·K). The electric conductivity was $1.9 \times 10^2$ Ω/sq.

Example 8

A pitch-based carbon fiber filler was produced by the same method as Example 1.

While mixing 30 parts by weight of the pitch-based carbon fiber filler with 90 parts by weight of alumina and half of the main solution of 70 parts by weight of a two-solution curable silicone-based resin (SD4570, trade name of Toray-Dow Silicone) for 30 minutes using a planetary mixer, the mixture was subjected to vacuum defoaming to produce an adhesive. A curing agent was added to the remaining half of the curing agent SD4570, and the thermal conductivity of the obtained cured heat-conductive adhesive was measured to be 5.2 W/(m·K). The electric conductivity was $4.9 \times 10^8$ Ω/sq.

Example 9

A pitch-based carbon fiber filler was produced by the same method as Example 1.

While mixing 30 parts by weight of the pitch-based carbon fiber filler with 120 parts by weight of zinc oxide and half of the main solution of 70 parts by weight of a two-solution curable silicone-based resin (SD4570, trade name of Toray-Dow Silicone) for 30 minutes using a planetary mixer, the mixture was subjected to vacuum defoaming to produce an adhesive. A curing agent was added to the remaining half of the curing agent SD4570, and the thermal conductivity of the obtained cured heat-conductive adhesive was measured to be 6.8 W/(m·K). The electric conductivity was $7.2 \times 10^8$ Ω/sq.

Example 10

A pitch-based carbon fiber filler was produced by the same method as Example 1.

While mixing 30 parts by weight of the pitch-based carbon fiber filler with 140 parts by weight of copper powder and 70 parts by weight of a two-solution curable epoxy-based resin (EPIKOTE 871, trade name of Japan Epoxy Resins Co., Ltd.) for 30 minutes using a planetary mixer, the mixture was subjected to vacuum defoaming to produce an adhesive.

The thermal conductivity of the cured heat-conductive adhesive, obtained by curing using the curing agent EPICURE 113, was measured to be 10.5 W/(m·K). The electric conductivity was $1.9 \times 10^1$ Ω/sq.

Example 11

A pitch-based carbon fiber filler was produced by the same method as Example 1.

While mixing 30 parts by weight of the pitch-based carbon fiber filler with 40 parts by weight of aluminum powder and 70 parts by weight of a two-solution curable epoxy-based resin (EPIKOTE 871, trade name of Japan Epoxy Resins Co., Ltd.) for 30 minutes using a planetary mixer, the mixture was subjected to vacuum defoaming to produce an adhesive.

The thermal conductivity of the cured heat-conductive adhesive, obtained by curing using the curing agent EPICURE 113, was measured to be 9.3 W/(m·K). The electric conductivity was $4.9 \times 10^1$ Ω/sq.

Example 12

A pitch-based carbon fiber filler was produced by the same method as Example 1.

While mixing 100 parts by weight of the pitch-based carbon fiber filler with 50 parts by weight of a two-solution curable epoxy-based resin (EPIKOTE 871, trade name of Japan Epoxy Resins Co., Ltd.) for 30 minutes using a planetary mixer, the mixture was subjected to vacuum defoaming to produce an adhesive.

The thermal conductivity of the cured heat-conductive adhesive, obtained by curing using the curing agent EPICURE 113, was measured to be 22.6 W/(m·K). The electric conductivity was $1.5 \times 10^0$ Ω/sq.

Example 13

Pitch-based three-dimensional random web carbon fibers were prepared by the same method as Example 1 but without pulverization. The mean fiber size of the graphitized pitch-based three-dimensional random web carbon fibers was 9.8 µm, and the ratio of the fiber size dispersion to the mean fiber size was 12%. The mean fiber length was 200 mm. The crystallite size in the direction of growth of the hexagonal mesh surface was 17 nm. When the surface of the pitch-based carbon fiber filler was observed with a scanning electron microscope, 4 defects were found in the visual field at 1000× magnification, indicating an essentially smooth surface.

While mixing 15 parts by weight of the pitch-based three-dimensional random web carbon fibers with 85 parts by weight of a two-solution curable epoxy-based resin (EPIKOTE 871, trade name of Japan Epoxy Resins Co., Ltd.) for 30 minutes using a planetary mixer, the mixture was subjected to vacuum defoaming to produce an adhesive.

The thermal conductivity of the cured heat-conductive adhesive, obtained by curing using the curing agent EPI-CURE 113, was measured to be 3.5 W/(m·K). The electric conductivity was $4.5 \times 10^1$ Ω/sq. When the resin was removed from the heat-conductive adhesive before curing and observed with an optical microscope, the fiber lengths were 200 mm but intermingling between the fibers was observed.

Example 14

Pitch comprising a fused polycyclic hydrocarbon compound was used as the starting material. The optical anisotropy percentage was 100% and the softening point was 287° C. Using a cap with a 0.2 mmϕ diameter, heated air was ejected from the slit at a linear speed of 7500 m per minute, dragging the molten pitch to form pitch-based staple fibers with a mean diameter of 9.5 μm. The melt viscosity of the pitch was 15 Pa·s. The spun fibers were collected on a belt to form a mat, and a three-dimensional random web composed of pitch-based staple fibers with a basis weight of 275 g/m² was obtained by cross-lapping.

The three-dimensional random web was heated in air from 170° C. to 285° C. at a mean temperature-elevating rate of 6° C./min, for infusibility treatment. The infusibilized three-dimensional random web was fired at 800° C., pulverized with a ball mill and graphitized at 3000° C. The mean fiber size of the pitch-based carbon fiber filler after graphitization was 7.2 μm, and the ratio of the fiber size dispersion to the mean fiber size (CV value) was 18%. The mean fiber length was 70 μm. The crystallite size in the direction of growth of the hexagonal mesh surface was 30 nm. When the surface of the pitch-based carbon fiber filler was observed with a scanning electron microscope, 5 defects were found in the visual field at 1000× magnification, indicating an essentially smooth surface.

While mixing 35 parts by weight of the pitch-based carbon staple fiber filler and half of the main solution of 65 parts by weight of a two-solution curable acrylic-based resin (ACRYSET 8087, trade name of Nippon Shokubai Co., Ltd.) for 30 minutes using a planetary mixer, the mixture was subjected to vacuum defoaming to produce an adhesive. A curing agent was added to the remaining half of the ACRYSET 8087, and the thermal conductivity of the obtained cured heat-conductive adhesive was measured to be 6.7 W/(m·K). The electric conductivity was $8.7 \times 10^3$ Ω/sq. The improved fill factor and high thermal conductivity were attributed to the large variation in fiber size.

Example 15

Pitch comprising a fused polycyclic hydrocarbon compound was used as the starting material. The optical anisotropy percentage was 100% and the softening point was 287° C. Using a cap with a 0.2 mmϕ diameter, the molten pitch was dragged without ejecting air from the slit, to form pitch-based fibers with a mean diameter of 18 μm. The spun fibers were collected on a belt. The viscosity of the molten pitch was 6 Pa·s.

The pitch-based fibers were heated in air from 170° C. to 285° C. at a mean temperature-elevating rate of 6° C./min, for infusibility treatment. The infusibilized pitch-based fibers were fired at 800° C. and then pulverized with a ball mill and graphitized at 3000° C. The mean fiber size of the pitch-based carbon fiber filler after graphitization was 13.1 μm, and the ratio of the fiber size dispersion to the mean fiber size (CV value) was 4%. The mean fiber length was 70 μm. The crystallite size in the direction of growth of the hexagonal mesh surface was 14 nm. When the surface of the pitch-based carbon fiber filler was observed with a scanning electron microscope, 6 defects were found in the visual field at 1000× magnification, indicating an essentially smooth surface.

While mixing 35 parts by weight of the pitch-based carbon staple fiber filler and half of the main solution of 65 parts by weight of a two-solution curable acrylic-based resin (ACRYSET 8087, trade name of Nippon Shokubai Co., Ltd.) for 30 minutes using a planetary mixer, the mixture was subjected to vacuum defoaming to produce an adhesive. A curing agent was added to the remaining half of the ACRYSET 8087, and the thermal conductivity of the obtained cured heat-conductive adhesive was measured to be 4.6 W/(m·K). The electric conductivity was $3.4 \times 10^4$ Ω/sq. Compared to Example 14, the mean fiber size was large and the fiber size distribution was low, resulting in a poorly packed state, while an increased number of gaps presumably reduced the thermal conductivity.

Comparative Example 1

Pitched-based three-dimensional random web carbon fibers graphitized by the same method as Example 1 were pulverized to obtain a pitch-based carbon fiber filler. The mean fiber size was 9.2 μm and the ratio of the fiber size dispersion to the mean fiber size was 15%. The mean fiber length was 55 μm. The crystallite size in the direction of growth of the hexagonal mesh surface was 17 nm. When the surface of the pitch-based carbon fiber filler was observed with a scanning electron microscope, 19 defects were found in the visual field at 1000× magnification, indicating that the smooth surface was essentially not smooth.

While mixing 100 parts by weight of the pitch-based carbon fiber filler with 50 parts by weight of a two-solution curable epoxy-based resin (EPIKOTE 871, trade name of Japan Epoxy Resins Co., Ltd.) for 30 minutes using a planetary mixer, the mixture was subjected to vacuum defoaming to produce an adhesive.

The heat-conductive adhesive obtained in this case had very high viscosity, and it was not possible to achieve smooth coating of the heat-conductive adhesive on a reference plate.

Comparative Example 2

A pitch-based carbon fiber filler was produced by the same method as Example 1.

While mixing 3 parts by weight of the pitch-based carbon fiber filler and half of the main solution of 97 parts by weight of a two-solution curable acrylic-based resin (ACRYSET 8087, trade name of Nippon Shokubai Co., Ltd.) for 30 minutes using a planetary mixer, the mixture was subjected to vacuum defoaming to produce an adhesive. A curing agent was added to the remaining half of the ACRYSET 8087, and the thermal conductivity of the obtained cured heat-conductive adhesive was measured to be 0.5 W/(m·K). The electric conductivity was $1.9 \times 10^9$ Ω/sq.

Comparative Example 3

A pitch-based carbon fiber filler was prepared by the same method as in Example 1, except that the graphitization temperature of the pitch-based carbon fiber filler was 1300° C. The mean fiber size was 10.6 μm and the ratio of the fiber size dispersion to the mean fiber size was 12%. The mean fiber length was 70 μm. The crystallite size in the direction of growth of the hexagonal mesh surface could not be measured because crystals were not apparent. When the surface of the pitch-based carbon fiber filler was observed with a scanning electron microscope, 9 defects were found in the visual field at 1000× magnification, indicating an essentially smooth surface.

While mixing 35 parts by weight of the pitch-based carbon fiber filler with 65 parts by weight of a two-solution curable epoxy-based resin (EPIKOTE 871, trade name of Japan Epoxy Resins Co., Ltd.) for 30 minutes using a planetary mixer, the mixture was subjected to vacuum defoaming to produce an adhesive.

The thermal conductivity of the cured heat-conductive adhesive, obtained by curing using the curing agent EPI-CURE 113, was measured to be 1.4 W/(m·K). The electric conductivity was $4.1 \times 10^6$ Ω/sq.

Comparative Example 4

Pitch-based three-dimensional random web carbon fibers were prepared by the same method as Example 13.

While mixing 3 parts by weight of the pitch-based three-dimensional random web carbon fibers with 97 parts by weight of a two-solution curable epoxy-based resin (EPIKOTE 871, trade name of Japan Epoxy Resins Co., Ltd.) for 30 minutes using a planetary mixer, the mixture was subjected to vacuum defoaming to produce an adhesive.

The thermal conductivity of the cured heat-conductive adhesive, obtained by curing using the curing agent EPI-CURE 113, was measured to be 0.8 W/(m·K). The electric conductivity was $7.5 \times 10^3$ Ω/sq.

Comparative Example 5

Three-dimensional random web carbon fibers were prepared by the same method as Example 13, except that the three-dimensional random web carbon fibers were heated at 300° C. for 1 hour under a nitrogen atmosphere before infusibility treatment to fuse the fibers together.

While mixing 15 parts by weight of the pitch-based three-dimensional random web carbon fibers with 85 parts by weight of a two-solution curable epoxy-based resin (EPIKOTE 871, trade name of Japan Epoxy Resins Co., Ltd.) for 30 minutes using a planetary mixer, the mixture was subjected to vacuum defoaming to produce an adhesive.

The heat-conductive adhesive obtained in this case had very high viscosity, and it was not possible to achieve smooth coating of the heat-conductive adhesive on a reference plate. When the resin was removed from the heat-conductive adhesive before curing and observed with an optical microscope, the fibers were found to be fragmented.

INDUSTRIAL APPLICABILITY

The heat-conductive adhesive of the invention utilizes the smoothness of the surface of the pitch-based carbon fiber filler, whereby the propagation of graphite crystals is controlled to be at least above a fixed size, in order to limit the viscosity, increase the handleability and obtain high thermal conductivity. In addition, adhesiveness onto heat spreading sheets or heat exchangers in electronic parts is also increased, thus enhancing the heat conduction efficiency and resulting in lighter weight.

What is claimed is:

1. A heat-conductive adhesive comprising a combination of 25-1900 parts by weight of a curable resin with respect to 100 parts by weight of a pitch-based carbon fiber filler which has an essentially smooth surface as observed with a scanning electron microscope and which has a crystallite size of at least 5 nm in the direction of growth of the hexagonal mesh surface and the percentage of the fiber size dispersion with respect to the mean fiber size (CV value) is 5-20, the heat-conductive adhesive being characterized in that the thermal conductivity of the heat-conductive adhesive is at least 3 W/(m·K).

2. A heat-conductive adhesive according to claim 1, wherein the pitch-based carbon fiber filler is obtained from a mesophase pitch starting material, the mean fiber size is 5-20 μm.

3. A heat-conductive adhesive according to claim 1, wherein the mean length of the pitch-based carbon fiber filler is 5-6000 μm.

4. A heat-conductive adhesive according to claim 1, wherein the mean length of the pitch-based carbon fiber filler is 50-1000 mm and the carbon fibers are combined with the curable resin in an intermingled state.

5. A heat-conductive adhesive according to claim 1, wherein the curable resin is an acrylic-based resin, epoxy-based resin, silicone-based resin, polyimide-based resin or urethane resin.

6. A heat-conductive adhesive according to claim 1, which further contains as a heat-conductive material, 1-500 parts by weight of at least one inorganic filler selected from the group consisting of aluminum oxide, magnesium oxide, zinc oxide, boron nitride, aluminum nitride, aluminum oxynitride, quartz and aluminum hydroxide, with respect to 100 parts by weight of the pitch-based carbon fiber filler.

7. A heat-conductive adhesive according to claim 6, which further contains as a heat-conductive material, 1-50 parts by weight of at least one inorganic filler selected from the group consisting of aluminum oxide, magnesium oxide, zinc oxide, boron nitride, aluminum nitride, aluminum oxynitride, quartz and aluminum hydroxide, with respect to 100 parts by weight of the pitch-based carbon fiber filler.

8. A heat-conductive adhesive according to claim 1, which further contains 1-500 parts by weight of at least one conductive filler selected from the group consisting of magnesium, gold, silver, copper, aluminum, iron and graphite, with respect to 100 parts by weight of the pitch-based carbon fiber filler.

9. A heat-conductive adhesive according to claim 8, which further contains, as a heat-conductive material, 1-50 parts by weight of at least one conductive filler selected from the group consisting of magnesium, gold, silver, copper, aluminum, iron and graphite, with respect to 100 parts by weight of the pitch-based carbon fiber filler.

10. A process for production of a heat-conductive adhesive according to claim 3, whereby a pitch fiber web is pulverized and fired, and then graphitized to obtain a pitch-based staple fiber filler, which is added to a curable resin.

11. A process for production of a heat-conductive adhesive according to claim 4, wherein a pitch fiber web is fired and then graphitized to obtain a three-dimensional random web carbon fiber filler in which the fibers are intermingled with each other, and this is combined with a curable resin.

* * * * *